(12) United States Patent
Nitto et al.

(10) Patent No.: US 7,608,982 B2
(45) Date of Patent: Oct. 27, 2009

(54) STACKED TYPE PIEZOELECTRIC ELEMENT AND VIBRATION WAVE MOTOR

(75) Inventors: Kiyoshi Nitto, Saitama (JP); Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 295 days.

(21) Appl. No.: 11/474,988

(22) Filed: Jun. 27, 2006

(65) Prior Publication Data
US 2007/0001556 A1    Jan. 4, 2007

(30) Foreign Application Priority Data
Jul. 4, 2005    (JP)    ............... 2005-194994

(51) Int. Cl.
*H01L 41/08*    (2006.01)
(52) U.S. Cl. .............. 310/323.12; 310/323.16
(58) Field of Classification Search ................. 310/328, 310/366, 323.12, 323.16
See application file for complete search history.

(56) References Cited

U.S. PATENT DOCUMENTS

| | | | | |
|---|---|---|---|---|
| 5,231,325 A * | 7/1993 | Tamai et al. | ........... | 310/323.12 |
| 5,543,879 A * | 8/1996 | Takagi | ......................... | 396/55 |
| 5,698,929 A | 12/1997 | Seki et al. | | |
| 5,770,916 A * | 6/1998 | Ezaki et al. | ................. | 310/366 |
| 5,814,919 A * | 9/1998 | Okumura | ................ | 310/323.12 |
| 6,046,526 A | 4/2000 | Maruyama | | |
| 6,051,911 A | 4/2000 | Kojima et al. | | |
| 6,081,063 A * | 6/2000 | Kasuga et al. | .......... | 310/323.02 |
| 6,191,520 B1 | 2/2001 | Maruyama et al. | | |
| 6,559,574 B2 | 5/2003 | Maruyama | | |
| 6,643,906 B2 | 11/2003 | Kitajima et al. | | |
| 6,747,397 B2 | 6/2004 | Maruyama | | |
| 7,061,159 B2 * | 6/2006 | Funakubo | .............. | 310/323.12 |

FOREIGN PATENT DOCUMENTS

| | | |
|---|---|---|
| JP | 2003-134858 | 5/2003 |
| JP | 2003-164171 | 6/2003 |

* cited by examiner

*Primary Examiner*—Mark Budd
(74) *Attorney, Agent, or Firm*—Fitzpatrick, Cella, Harper & Scinto

(57) ABSTRACT

Provided is a stacked type piezoelectric element including a surface electrode layer as a first layer and a piezoelectric layer as a second layer. A third layer to an N-th layer thereof are formed by alternately arranging piezoelectric layers and piezoelectric layers. A surface of the piezoelectric layer is provided with four-way split inner electrodes S+, B+, A−, and B−. A surface of the piezoelectric layer is provided with four-way split inner electrodes AG+, BG+, AG−, and BG−. A surface of the piezoelectric layer is provided with four-way split inner electrodes of A+, B+, A−, and B−. The piezoelectric layers are formed such that only the inner electrode S+ serving as a sensor phase and the inner electrodes A+ and AG+ being arranged in the same phase as the inner electrode S+ are exposed to an outside of the piezoelectric layer.

8 Claims, 9 Drawing Sheets

STACKED TYPE PIEZOELECTRIC ELEMENT AND VIBRATION WAVE MOTOR

BACKGROUND OF THE INVENTION

1. Field of the Invention

The present invention relates to a stacked type piezoelectric element and a vibration wave motor.

2. Related Background Art

As an example of electro-mechanical energy conversion elements, there is a stacked type piezoelectric element capable of generating a large deformation distortion and a large force with a low voltage. The stacked type piezoelectric element is disclosed in U.S. Pat. No. 5,770,916, and is used for a vibration wave motor, for example.

The stacked type piezoelectric element of this kind has a laminated structure in which a plurality of piezoelectric layers composed of, for example, piezoelectric ceramics are stacked. On a surface of each piezoelectric layer, inner electrodes composed of an electrode material are formed.

A structure of the stacked type piezoelectric element will be described with reference to FIGS. 7A and 7B. FIG. 7A is a side view of a conventional stacked type piezoelectric element, and FIG. 7B is a diagram of the stacked type piezoelectric element shown in FIG. 7A which is broken down into piezoelectric layers.

As shown in FIG. 7A, a stacked type piezoelectric element 70 has a cylindrical laminated structure in which a plurality of piezoelectric layers are stacked. As shown in FIG. 7B, in a case where the stacked type piezoelectric element 70 has 25 piezoelectric layers, for example, a surface electrode layer 75 is arranged as a first layer thereof, and a piezoelectric layer 71 serving as a sensor layer is arranged as a second layer thereof. From a third layer to a twenty-fifth layer of the stacked type piezoelectric element 70, piezoelectric layers 72 and piezoelectric layers 73 are alternately arranged. A surface of the piezoelectric layer 71 is provided with four-way split inner electrodes S+, B+, A−, and B−. A surface of each of the piezoelectric layers 72 is provided with four-way split inner electrodes AG+, BG+, AG−, and BG−. A surface of each of the piezoelectric layers 73 is provided with four-way split inner electrodes A+, B+, A−, and B−.

The surface electrode layer 75 and the piezoelectric layers 71 to 73 that constitute the stacked type piezoelectric element 70 have an opening at respective center portions thereof, and are formed in a disc shape having the same outer diameter size. The piezoelectric layer 71 is provided with five through-holes 74. The through-holes are holes piercing the piezoelectric layers and filled with a conductive material. Each of the piezoelectric layers 72 and 73 is provided with four through-holes 74. The inner electrodes AG+, BG+, AG−, and BG− of the piezoelectric layers 72 are electrically connected to one another via the through-holes 74 which correspond to an upper piezoelectric layer or a lower piezoelectric layer. However, the piezoelectric layer 72 as the twenty-fifth layer is a bottom layer, so the piezoelectric layer 72 is not provided with any through-holes. The inner electrodes A+, B+, A−, and B− of the piezoelectric layers 71 and 73 are electrically connected to one another via the through-holes 74 which correspond to an upper piezoelectric layer or a lower piezoelectric layer. The surface electrode layer 75 is provided with nine electrodes for allowing the surface electrode layer 75 to be electrically in contact with an outside. Each electrode of the surface electrode layer 75 is electrically connected to the nine inner electrodes AG+, BG+, AG−, BG−, A+, B+, A−, and B− connected via corresponding through-holes 74, and to the inner electrode S+ of a sensor phase.

To the stacked type piezoelectric element 70 having the above-mentioned structure, a polarized process is applied to excite a vibration suitable for a vibration wave motor.

Next, a rod-type vibration wave motor using the stacked type piezoelectric element 70 will be described with reference to FIGS. 8 and 9. FIG. 8 is a longitudinal-sectional view of the rod-type vibration wave motor using the stacked type piezoelectric element 70 shown in FIGS. 7A and 7B. FIG. 9 is a graph showing a relation of a phase difference (θA−S1) between an applied voltage of the inner electrode A+ and an output signal (S1) of the inner electrode S+ to a frequency of the stacked type piezoelectric element, and a relation of an amplitude (VS1) of the output signal (S1) to the frequency of the stacked type piezoelectric element.

As shown in FIG. 8, a rod-type vibration wave motor 80 includes a vibration device 81. The vibration device 81 includes an elastic member 82, an elastic member 83, the stacked type piezoelectric element 70, and a wiring substrate 85, which are all pierced by a shaft 84. The stacked type piezoelectric element 70 is arranged between the elastic member 82 and the elastic member 83. The wiring substrate 85 is arranged between the stacked type piezoelectric element 70 and the elastic member 83. The nine electrodes formed on the surface electrode layer 75 of the stacked type piezoelectric element 70 are electrically connected to corresponding electrode patterns on the wiring substrate 85, respectively. The elastic member 82, the elastic member 83, the stacked type piezoelectric element 70, and the wiring substrate 85 are held and fixed by the shaft 84 and a nut 90 which is screwed into an end portion of the shaft 84.

The elastic member 82 is brought into pressurized contact with a rotor 88 via a spring 86 and a spring support member 87. In this case, one surface of the elastic member 82 is provided with a friction member 82a, and the rotor 88 is provided with a contact member 88a which is brought into pressurized contact with the friction member 82a. The rotor 88 is engaged with a gear 89. The gear 89 is rotatably supported by a fixing member 91 which is fixed to the shaft 84 by a nut 92.

In this case, the inner electrodes A+ and A− of a phase A and the inner electrodes B+ and B− of a phase B, and the inner electrodes AG+ and AG− of a phase AG and the inner electrodes BG+ and BG− of a phase BG, which are opposed to each other, are connected to a ground, respectively. The inner electrodes A+ and A− of the phase A are applied with a high-frequency voltage having a frequency substantially equal to a natural frequency of a vibration device. Further, the inner electrodes B+ and B− of the phase B having a space phase position different from the phase A by π/2(rad) are applied with a high-frequency voltage having the same frequency and a phase electrically different from the phase A by π/2(rad). As a result, the vibration device 81 incorporated with the stacked type piezoelectric element 70 generates two orthogonal bending vibrations. The rotor 88 brought into pressurized contact with the vibration device 81 is frictionally driven to be rotated around the shaft 84. In association with the rotation of the rotor 88, the gear 89 is rotationally driven.

As a frequency (AC frequency) of a high-frequency voltage applied to the inner electrodes, a neighborhood of a resonant frequency of a natural mode of the vibration device 81 is generally selected. However, the resonant frequency of the vibration device 81 changes within a range of several hundreds to several thousands Hz due to a variation in each solid, ambient temperature, loads on the vibration device 81, or the like. In order to drive the vibration device 81 efficiently and stably, the AC frequency of an input voltage needs to be controlled, and a sensing means for monitoring a vibration state of the vibration device 81 should be provided. Thus, the stacked type piezoelectric element 70 is provided with the piezoelectric layer 71 as a sensor layer.

The piezoelectric layer 71 is distorted due to flexion deformity of the vibration device 81, and generates a charge by a piezoelectric effect. The inner electrode S+ provided to the piezoelectric layer 71 is arranged at a position where a phase thereof coincides with that of the inner electrode A+. FIG. 9 shows the relation of a phase difference (hereinafter, referred to as "θA–S1") between an applied voltage of the inner electrode A+ and an output signal (hereinafter, referred to as "S1") of the inner electrode S+ to the frequency of this case, and the relation of an amplitude (VS1) of the output signal S1 to the frequency of this case. When the vibration device 81 is driven in a bending vibration mode, the phase difference θA–S1 at a resonant frequency Fr becomes π/2(rad) both in a clockwise direction (CW) and in a counter-clockwise direction (CCW). As the frequency becomes higher than the resonant frequency, the phase difference θA–S1 is gradually deviated from π/2(rad). The amplitude (VS1) of the output signal becomes a maximum value in the vicinity of the resonant frequency, and gradually becomes smaller as the frequency becomes higher than the resonant frequency.

In addition, a vibration wave motor which is more compact than the above-mentioned vibration wave motor is disclosed in Japanese Patent Application No. 2003-134858, for example.

In order to provide a vibration wave motor with a stable performance, Japanese Patent Application No. 2003-164171 discloses a method of deliberately adjusting decay components of the phase A and the phase B as a method of reducing unevenness of a traveling wave, i.e., unevenness of an amplitude of a vibration wave, which is closely related to the performance thereof. In addition to this, proposed is, for example, a method of setting a difference between two resonant frequencies Δf(=fa(resonance frequency of phase A)–fb (resonance frequency of phase B)) to 10 Hz≦fa–fb≦100 Hz.

In recent years, particularly the above-mentioned vibration wave motor is strongly demanded to achieve a smaller size, a higher efficiency, and a higher output in order to be adaptable to a variety of applications.

However, in a case where the stacked type piezoelectric element with the conventional structure is used for a more compact vibration wave motor, larger-than-expected unevenness of traveling wave is caused. To be specific, the vibration device is downsized with respect to the compact vibration wave motor, and the stacked type piezoelectric element is also downsized. As the stacked type piezoelectric element is downsized, the capacitance of the stacked type piezoelectric element becomes smaller, and the electric resonant frequency value (=½/π/≦√LC), which greatly affects the amplitude of each phase, changes to a large extent only by a little difference in capacitance.

For example, in a case where a motor having a mechanical resonant frequency of 60 kHz and a capacitance of 70 nF of each phase is provided with a sensor layer as shown in FIG. 7B, the electric resonant frequency value changes by about 1.2 kHz. On the contrary, when the capacitance of each phase is set to 30 nF, the electric resonant frequency value changes by about 3 kHz, which is twice and a half of the former case. A prerequisite for this case is that a difference between the electric resonant frequency and the mechanical resonant frequency is kept to be substantially equal.

Up to now, it is known that an input power of each phase changes due to the difference between the electric resonant frequency and the mechanical resonant frequency. In other words, an imbalance between the phase A and the phase B is caused due to the capacitance of the sensor phase which is provided in the same phase as the phase A serving as a sensing means for monitoring a vibration state of the vibration device of the stacked type piezoelectric element used for the compact vibration device. Such the imbalance is supposed to be a major cause of the generation of unevenness of the traveling wave.

SUMMARY OF THE INVENTION

According to one aspect of the invention, there is provided a stacked type piezoelectric element, including:

a plurality of piezoelectric layers to be stacked one on another; and driving electrodes that are each arranged between the plurality of piezoelectric layers and divided into a plurality of inner electrodes, in which at least a part of the driving electrodes are each divided into the plurality of inner electrodes that include at least one inner electrode a part of which is exposed to an outside thereof.

According to another aspect of the invention, there is provided a vibration wave motor, including:

a stacked type piezoelectric element having a plurality of piezoelectric layers stacked one on another;

elastic members fixed to the stacked type piezoelectric element;

a rotor that is provided in contact with the elastic members and driven by vibrations generated in the elastic members; and driving electrodes that are each arranged between the piezoelectric layers of the stacked type piezoelectric element, and each divided into a plurality of inner electrodes, in which at least a part of the driving electrodes are each divided into the plurality of inner electrodes that include at least one inner electrode a part of which is exposed to an outside thereof.

BRIEF DESCRIPTION OF THE DRAWINGS

The accompanying drawings, which are incorporated in and constitute a part of the specification, illustrate embodiments of the invention and, together with the description, serve to explain the principles of the invention, in which.

DESCRIPTION OF THE PREFERRED EMBODIMENTS

The following description of exemplary embodiments is merely illustrative in nature and is in no way intended to limit the invention, its application, or uses.

Processes, techniques, apparatuses, and materials as known by one of ordinary skill in the art may not be discussed in detail but are intended to be part of the enabling description where appropriate.

First Embodiment

Figure 1A:
FIG. 1A is an elevation of a stacked type piezoelectric element according to a first embodiment of the present invention.
Figure 1B:
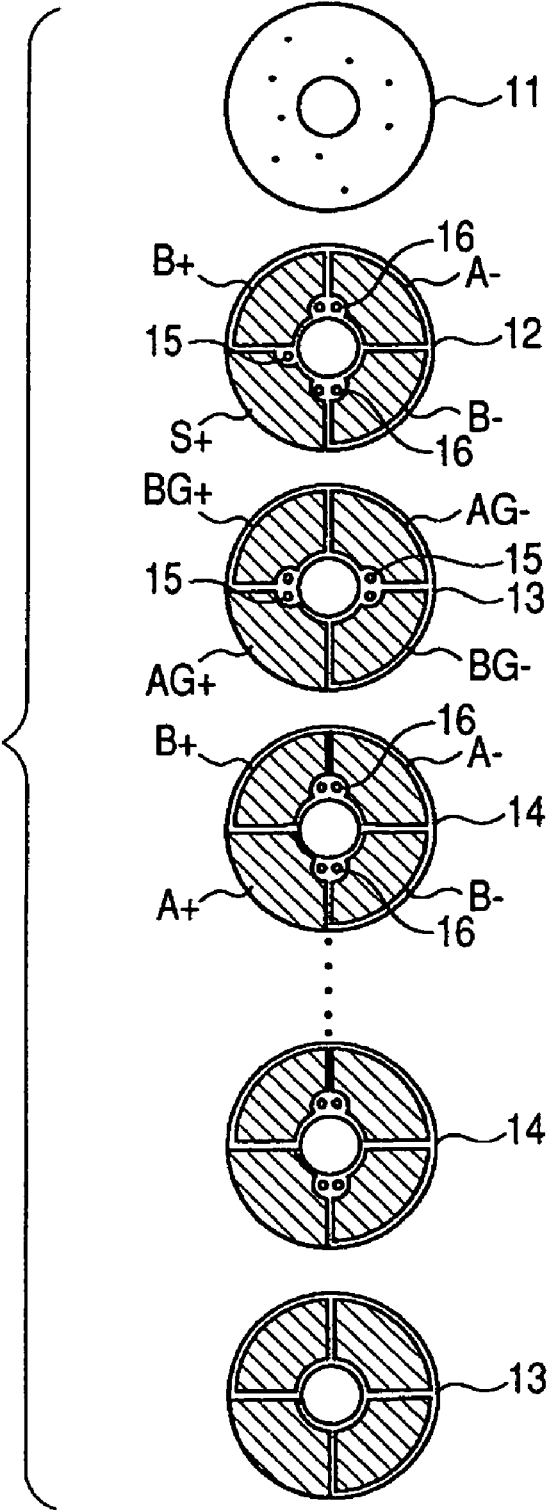
FIG. 1B is a diagram of the stacked type piezoelectric element shown in FIG. 1A which is broken down into piezoelectric layers.

FIG. 1A is an elevation of a stacked type piezoelectric element according to a first embodiment of the present invention, and FIG. 1B is a diagram of the stacked type piezoelectric element shown in FIG. 1A which is broken down into piezoelectric layers.

As shown in FIG. 1A, a stacked type piezoelectric element 10 has a cylindrical laminated structure in which a plurality of piezoelectric layers are stacked. As shown in FIG. 1B, in the stacked type piezoelectric element 10, a surface electrode layer 11 is arranged as a first layer, and a piezoelectric layer (sensor layer) 12 is arranged as a second layer. From a third layer to an N-th layer of the stacked type piezoelectric element 10, piezoelectric layers 13 and piezoelectric layers 14 are alternately arranged. The piezoelectric layers 12 to 14 are formed in the same cylindrical shape and have an opening at respective center portions thereof.

The surface electrode layer 11 is provided with nine surface electrodes (black dots shown in FIG. 1B). A surface of the piezoelectric layer 12 is provided with four-way split inner electrodes S+, B+, A–, and B–. A surface of the piezoelectric layer 13 is provided with four-way split inner electrodes AG+, BG+, AG–, and BG–. A surface of the piezoelectric layer 14 is provided with four-way split inner electrodes A+, B+, A–, and B–.

Further, the piezoelectric layer 12 is provided with one through-hole 15 and four through-holes 16. Each of the piezoelectric layers 13 is provided with four through-holes 15. The piezoelectric layers 14 are respectively provided with four through-holes 16. With regard to the inner electrodes A+, B+, A–, B–, AG+, BG+, AG–, and BG– of each layer, the inner electrode AG+ is electrically connected via the through-hole 16 of an upper layer and a lower layer which corresponds to the piezoelectric layer 14. Then, the inner electrode AG+ is finally connected to the electrode corresponding to the surface electrode layer 11 via the through-hole 16 of the piezoelectric layer 12. In a similar manner, other inner electrodes A+, B+, A–, B–, BG+, AG–, and BG– are electrically connected to one another via the corresponding through-holes 15 and 16, and finally are electrically connected to the electrode corresponding to the surface electrode layer 11. In addition, the inner electrode S+ serving as a sensor phase is electrically connected to the electrode corresponding to the surface electrode layer 11.

In this case, the piezoelectric layers 12 to 14 are formed such that only the inner electrode S+ serving as a sensor phase and the inner electrodes A+ and AG+ arranged in the same phase as the inner electrode S+ are exposed to an outside of the piezoelectric layer. With this structure, it is possible to offset the difference between the phase A and the phase B in the piezoelectric layer 12 by the piezoelectric layers 13 and 14. The piezoelectric layers are thus structured, so it is possible to make the capacitance of the phase A approximate to (or equal to) that of the phase B.

As a result, it is possible to reduce the imbalance between the capacitance of the phase A and that of the phase B due to the sensor phase which is provided in the same phase as the phase A serving as a sensing means for monitoring the vibration state of the vibration device constituted of the stacked type piezoelectric element 10. It is also possible to reduce the unevenness of the traveling wave due to the imbalance between the capacitance of the phase A and that of the phase B. Through the surface electrode layer 11, it is possible to judge a state of both sides of the stacked type piezoelectric element 10 by using an electrical detecting means.

In this embodiment, it should be noted that the case where the stacked type piezoelectric element is formed in a cylindrical shape is described, but the outer shape of the stacked type piezoelectric element is not limited thereto, and other shapes such as a rectangular parallelepiped may be adopted.

Further, as apparent from FIG. 1A, the piezoelectric layer is formed such that only a particular inner electrode is exposed to an outside thereof, thereby making it easier to grasp the phase of the piezoelectric layer and to align the phases of the piezoelectric layers. This structure is effective in grasping the phase in a case where the piezoelectric layer has an outer shape such as a circle or a regular polygon whose direction is difficult to be grasped when the piezoelectric layer is rotated.

Second Embodiment

Figures 2A, 2B:
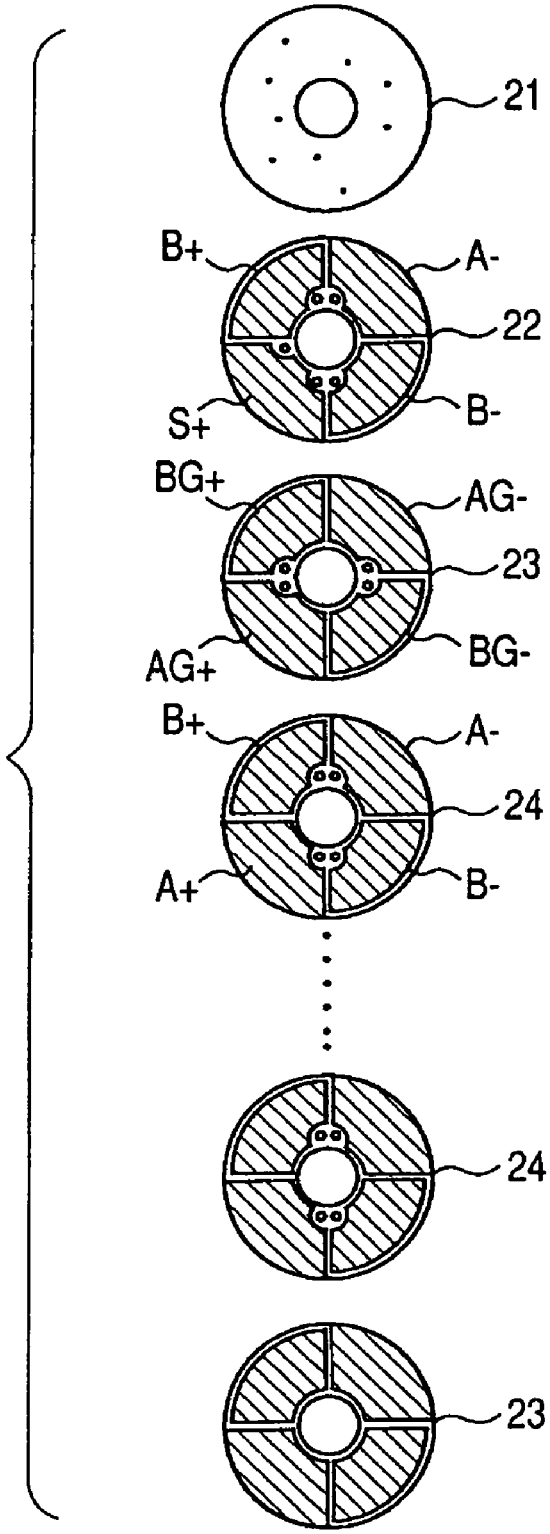
FIG. 2A is an elevation of a stacked type piezoelectric element according to a second embodiment of the present invention.
FIG. 2B is a diagram of the stacked type piezoelectric element shown in FIG. 2A which is broken down into piezoelectric layers.

Next, a second embodiment of the present invention will be described with reference to FIGS. 2A and 2B. FIG. 2A is an elevation of a stacked type piezoelectric element according to the second embodiment of the present invention, and FIG. 2B is a diagram of the stacked type piezoelectric element shown in FIG. 2A which is broken down into piezoelectric layer.

As shown in FIG. 2A, a stacked type piezoelectric element 20 of this embodiment has a cylindrical laminated structure in which a plurality of piezoelectric layers are stacked. As shown in FIG. 2B, a surface electrode layer 21 and piezoelectric layers 22 to 24 that constitute the stacked type piezoelectric element 20 are structured in the same manner as in the first embodiment. However, the stacked type piezoelectric element 20 is structured in such a manner that inner electrodes A+ and AG+, which are arranged in the same phase as an inner electrode S+ serving as a sensor phase, and inner electrodes A– and AG–, which are arranged at a position deviated from the inner electrode S+ by $\pi/2$(rad), are exposed to an outside of the piezoelectric layers.

According to this embodiment having the above-mentioned structure, the same effect as in the first embodiment can be obtained.

An outer shape of the stacked type piezoelectric element 20 is not limited to a cylindrical shape, but other shapes such as a rectangular parallelepiped may be adopted.

Third Embodiment

Figures 3A, 3B:
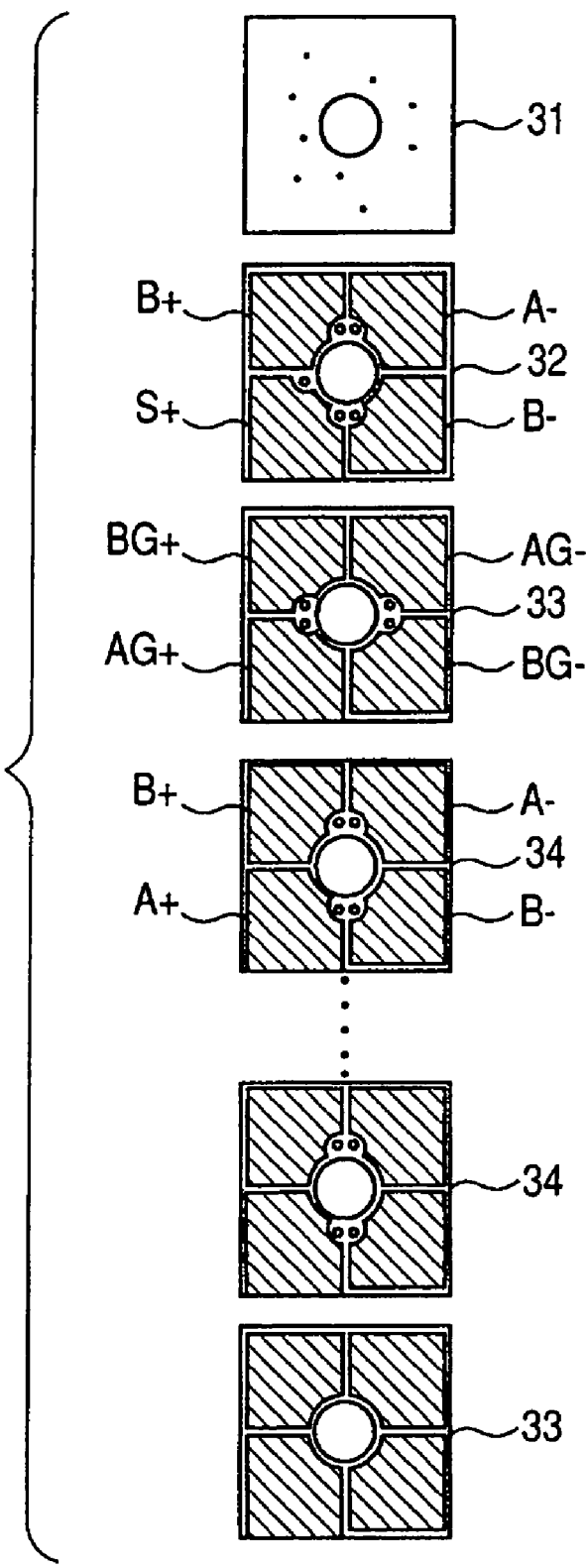
FIG. 3A is an elevation of a stacked type piezoelectric element according to a third embodiment of the present invention.
FIG. 3B is a diagram of the stacked type piezoelectric element shown in FIG. 3A which is broken down into piezoelectric layers.

Next, a third embodiment of the present invention will be described with reference to FIGS. 3A and 3B. FIG. 3A is an elevation of a stacked type piezoelectric element according to the third embodiment of the present invention, and FIG. 3B is a diagram of the stacked type piezoelectric element shown in FIG. 3A which is broken down into piezoelectric layers.

As shown in FIG. 3A, a stacked type piezoelectric element 30 according to this embodiment has a laminated structure in a shape of a rectangular parallelepiped in which a plurality of piezoelectric layers are stacked and whose cross-section has a square shape. As shown in FIG. 3B, a surface electrode layer 31 and piezoelectric layers 32 to 34 that constitute the stacked type piezoelectric element 30 are structured in the same manner as in the first embodiment. However, in the stacked type piezoelectric element 30, an inner electrode S+ serving as a sensor phase, and inner electrodes A+ and AG+ which are arranged in the same phase as the inner electrode S+ are formed such that only a portion along an edge of one side is exposed to an outside of the piezoelectric layer.

According to this embodiment having the above-mentioned structure, the same effect as in the first embodiment can be obtained.

In addition, a cross-sectional shape of the stacked type piezoelectric element 30 is not limited to a square, but other cross-sectional shapes such as a rectangle may be adopted.

Fourth Embodiment

Figures 4A, 4B:
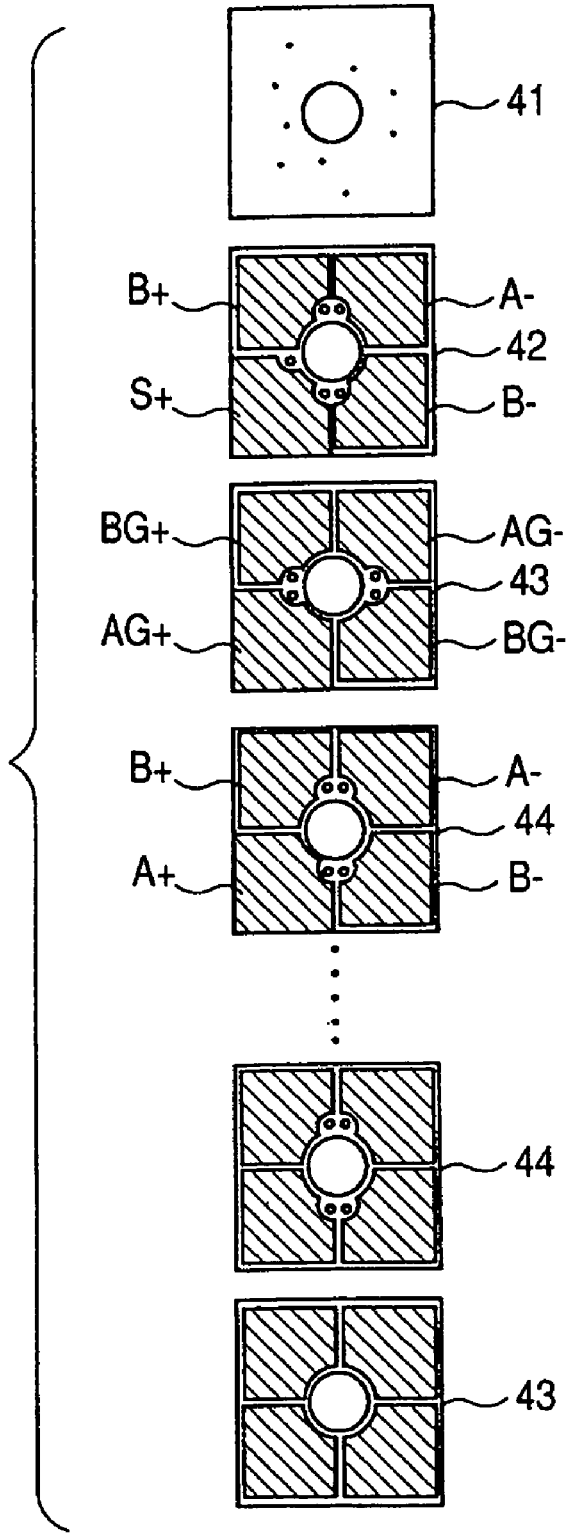
FIG. 4A is an elevation of a stacked type piezoelectric element according to a fourth embodiment of the present invention.
FIG. 4B is a diagram of the stacked type piezoelectric element shown in FIG. 4A which is broken down into piezoelectric layers.

Next, a fourth embodiment of the present invention will be described with reference to FIGS. 4A and 4B. FIG. 4A is an elevation of a stacked type piezoelectric element according to the fourth embodiment of the present invention, and FIG. 4B is a diagram of the stacked type piezoelectric element shown in FIG. 4A which is broken down into piezoelectric layers.

As shown in FIG. 4A, a stacked type piezoelectric element 40 according to this embodiment has a laminated structure in a shape of a rectangular parallelepiped in which a plurality of piezoelectric layers are stacked and whose cross-section has a square shape. As shown in FIG. 4B, a surface electrode layer 41 and piezoelectric layers 42 to 44 that constitute the stacked type piezoelectric element 40 are structured in the same manner as in the first embodiment. However, in the stacked type piezoelectric element 40, among an inner electrode S+ serving as a sensor phase and inner electrodes A+ and AG+ arranged in the same phase as the inner electrode S+, inner electrodes A+ and AG+ of a predetermined number of the piezoelectric layers 43 and 44, which are provided to a lower layer of the piezoelectric layer 42, are formed such that only a portion along an edge of one side is exposed to an outside of the piezoelectric layer.

According to this embodiment having the above-mentioned structure, the same effect as in the first embodiment can be obtained.

In addition, a cross-sectional shape of the stacked type piezoelectric element 40 is not limited to a square, but other cross-sectional shapes such as a rectangle may be adopted.

Fifth Embodiment

Figures 5A, 5B:
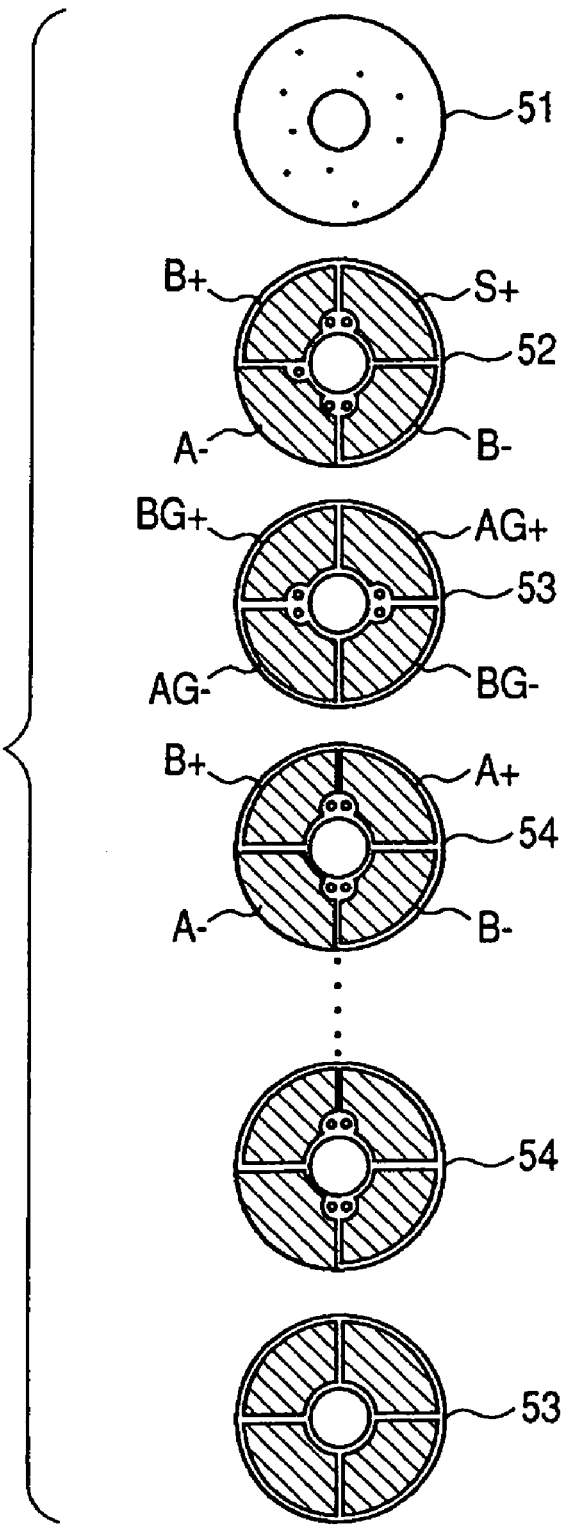
FIG. 5A is an elevation of a stacked type piezoelectric element according to a fifth embodiment of the present invention.
FIG. 5B is a diagram of the stacked type piezoelectric element shown in FIG. 5A which is broken down into piezoelectric layers.

Next, a fifth embodiment of the present invention will be described with reference to FIGS. 5A and 5B. FIG. 5A is an elevation of a stacked type piezoelectric element according to the fifth embodiment of the present invention, and FIG. 5B is a diagram of the stacked type piezoelectric element shown in FIG. 5A which is broken down into piezoelectric layers.

As shown in FIG. 5A, a stacked type piezoelectric element 50 according to this embodiment has a cylindrical laminated structure in which a plurality of piezoelectric layers are stacked. As shown in FIG. 5B, a surface electrode layer 51 and piezoelectric layers 52 to 54 that constitute the stacked type piezoelectric element 50 are structured in the same manner as in the first embodiment. However, in the stacked type piezoelectric element 50, an inner electrode A− is formed such that a part thereof is exposed to an outside of the piezoelectric layers 52 and 54.

According to this embodiment having the above-mentioned structure, the same effect as in the first embodiment is obtained.

In addition, an outer shape of the stacked type piezoelectric element 50 is not limited to a cylindrical shape, but other shapes may be adopted.

Sixth Embodiment

Figure 6:
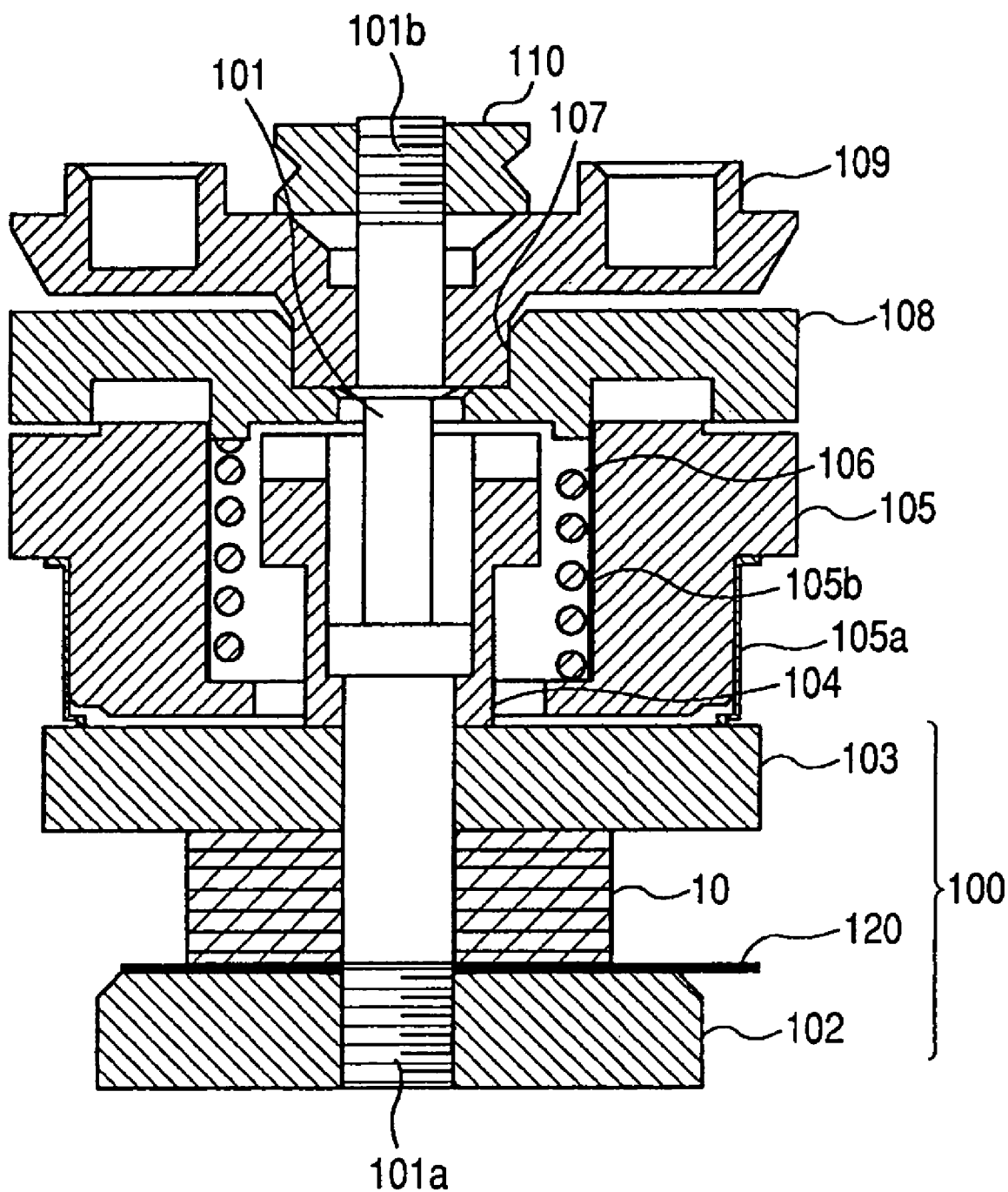
FIG. 6 is a longitudinal-sectional view of a structure of a vibration wave motor using the stacked type piezoelectric element shown in FIGS. 1A and 1B.
Figures 7A, 7B:
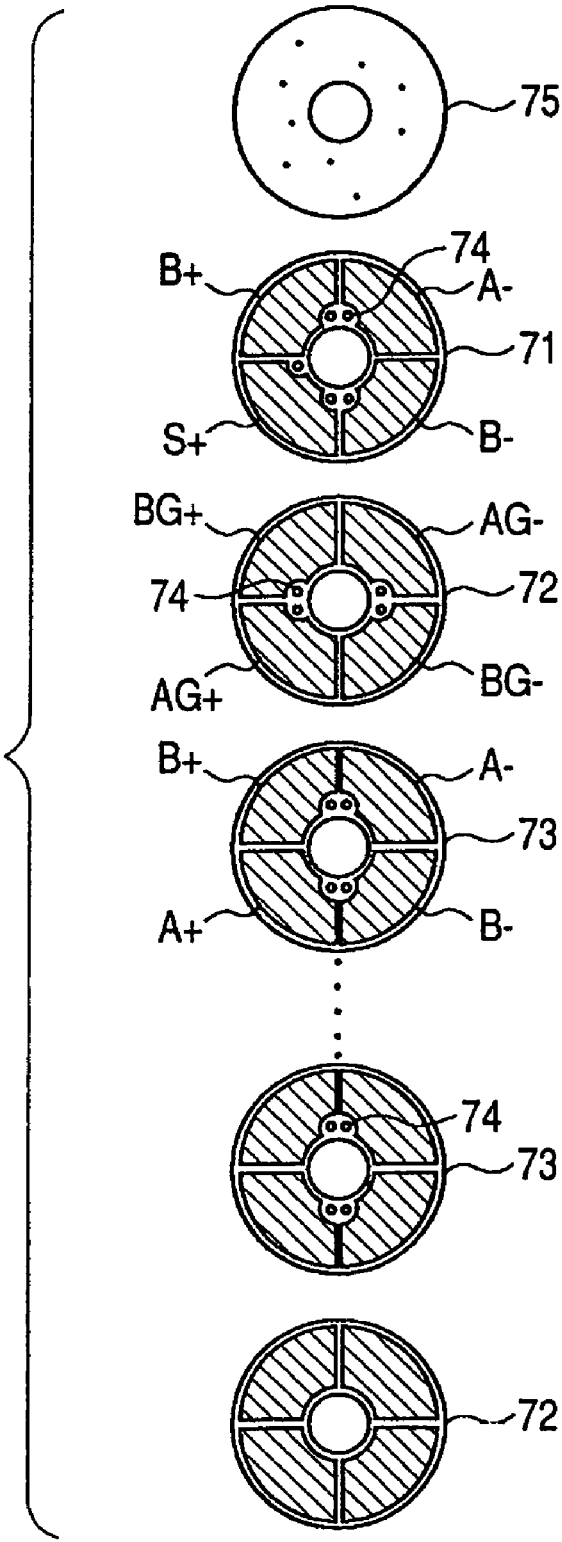
FIG. 7A is a side view of a conventional stacked type piezoelectric element.
FIG. 7B is a diagram of the stacked type piezoelectric element shown in FIG. 7A which is broken down into piezoelectric layers.
Figure 8:
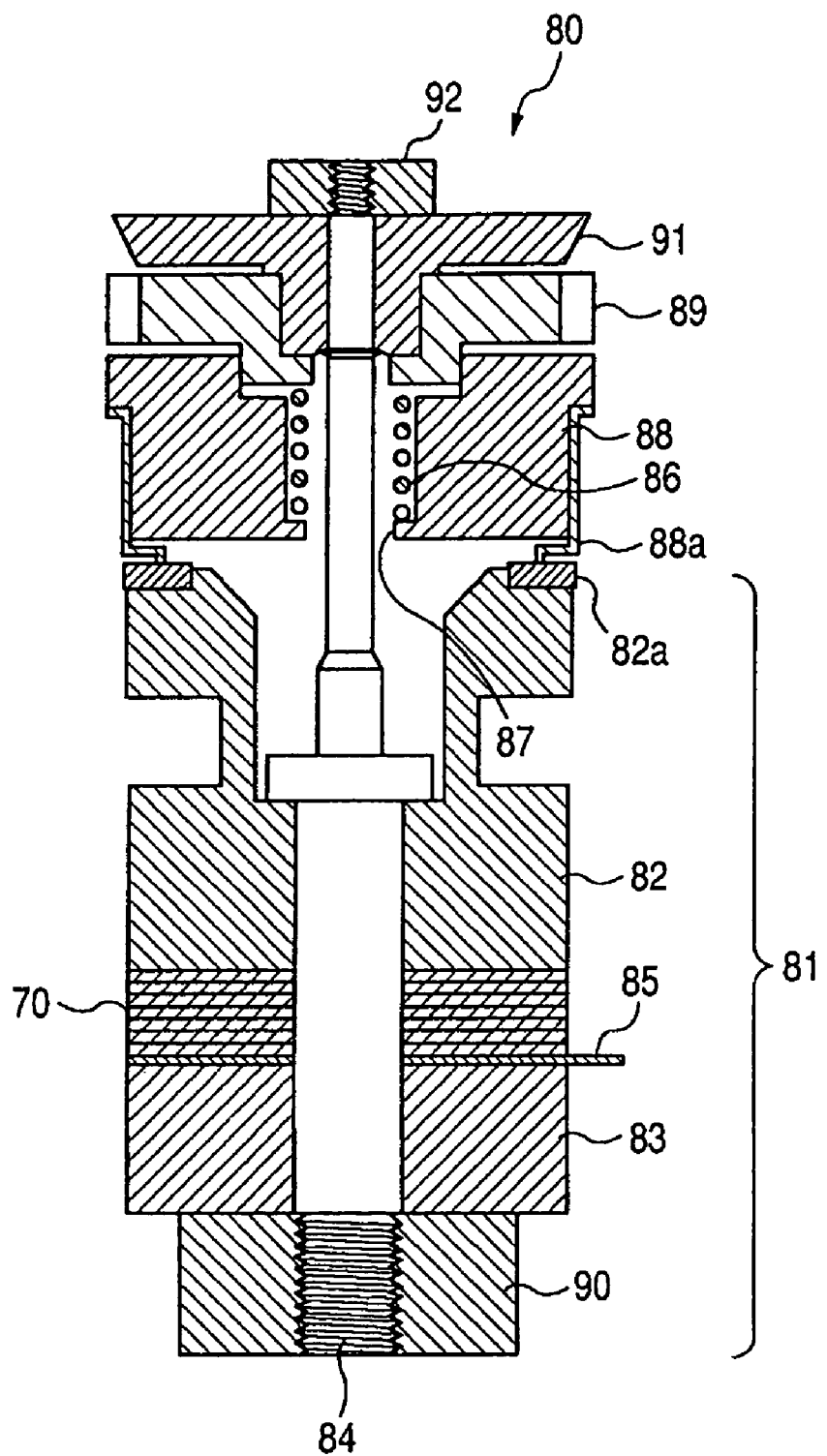
FIG. 8 is a longitudinal-sectional view of a rod-type vibration wave motor using the stacked type piezoelectric element shown in FIGS. 7A and 7B.
Figure 9:
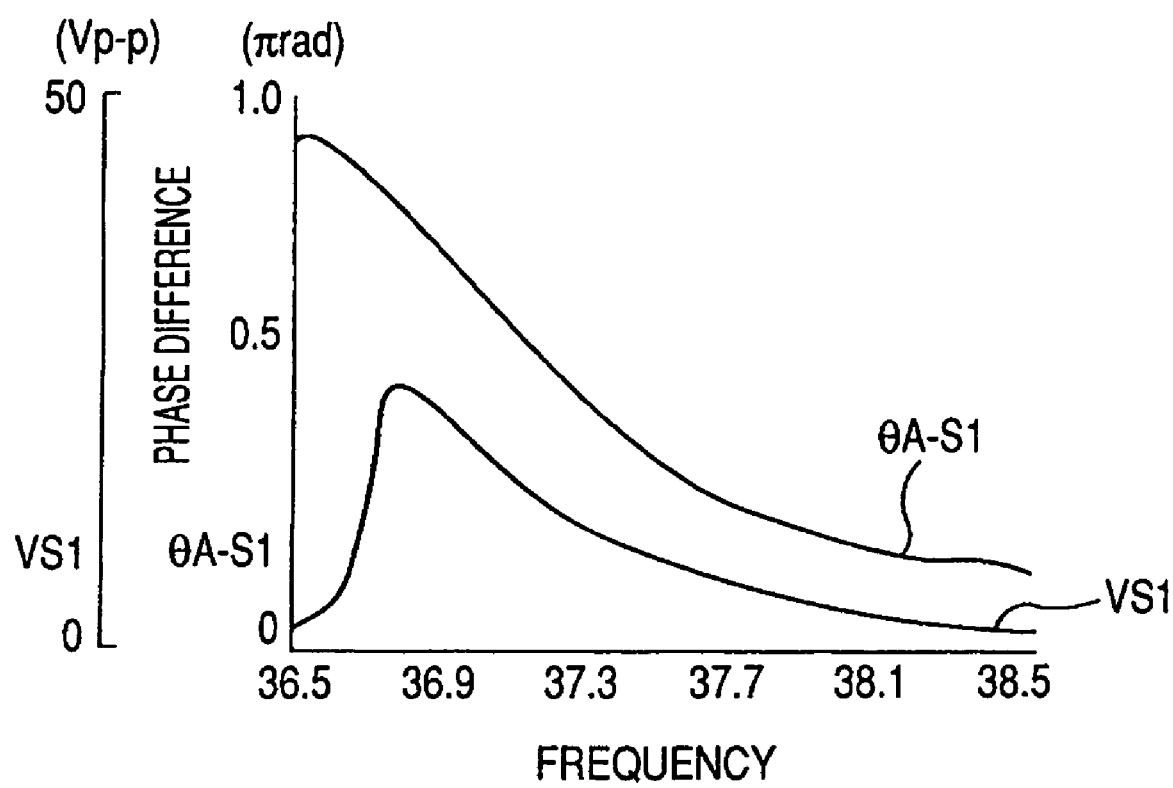
FIG. 9 is a graph showing a relation of a phase difference ($\theta$A–S1) between an applied voltage of an inner electrode A+ and an output signal (S1) of an inner electrode S+ to a frequency of the stacked type piezoelectric element, and a relation of an amplitude (VS1) of the output signal (S1) to the frequency of the stacked type piezoelectric element.

Next, a vibration wave motor using the stacked type piezoelectric element 10 shown in FIGS. 1A and 1B will be described with reference to FIG. 6. FIG. 6 is a longitudinal-sectional view of a structure of a vibration wave motor using the stacked type piezoelectric element shown in FIGS. 1A and 1B.

As shown in FIG. 6, the vibration wave motor includes a vibration device 100. The vibration device 100 includes an elastic member 102, an elastic member 103, the stacked type piezoelectric element 10, a clamping member 104, and a flexible wiring substrate 120. In this case, the stacked type piezoelectric element 10 has the above-mentioned structure shown in FIGS. 1A and 1B. The elastic member 102, the elastic member 103, the stacked type piezoelectric element 10, the holding member 104, and a flexible wiring substrate 120 that constitute the vibration device 100 are pierced by a shaft 101. At each end of the shaft 101, a screw member 101a and a screw member 101b are formed. The screw member 101a of the shaft 101 is screwed into the elastic member 102. The holding member 104 is engaged with the shaft 101 so that a movement in a direction along the shaft 101 is regulated. The stacked type piezoelectric element 10 is arranged between the elastic member 102 and the elastic member 103, and the elastic member 103 is arranged between the stacked type piezoelectric element 10 and the holding member 104. The flexible wiring substrate 120 is arranged between the stacked type piezoelectric element 10 and the elastic member 102. Nine electrodes formed on the surface electrode layer 11 of the stacked type piezoelectric element 10 are electrically connected to corresponding electrode patterns on the flexible wiring substrate 120. As a result, the stacked type piezoelectric element 10, the elastic member 103, and the flexible wiring substrate 120 are clamped and fixed between the elastic member 102 and the holding member 104 with respect to the shaft 101.

A fixing member 109 for fixing a motor to an outside thereof is fitted to the shaft 101, and the fixing member 109 is fixed by a nut 110 screwed with the screw member 101b of the shaft 101 with respect to the shaft 101. Between the fixing member 109 and the elastic member 103, a rotor 105 and an output gear 108 are arranged. The rotor 105 and the output gear 108 are coaxially pierced with respect to the shaft 101. The rotor 105 is engaged with the output gear 108.

The output gear 108 is rotatably supported with respect to the fixing member 109 via a slide bearing 107. Between the output gear 108 and the rotor 105, a spring 106 is arranged. The spring 106 is contained in a spring case 105b arranged on an inner diameter side of the rotor 105. The rotor 105 is provided with a contact member 105a brought into pressurized contact with a surface of the elastic member 103. The rotor 105 is pressed by the spring 106 such that the contact member 105a is brought into pressurized contact with the elastic member 103.

When the vibration wave motor having the above-mentioned structure is driven, the stacked type piezoelectric element 10 is applied with an AC electric field having a phase difference of $\pi/2$ in terms of time via the flexible wiring substrate 120. As a result, two bending vibrations orthogonal to each other in two directions are excited in the stacked type piezoelectric element 10, and two orthogonal bending vibrations are generated in the elastic member 103. The rotor 105, which is brought into pressurized contact with the elastic member 103, is frictionally driven to be rotated by the bending vibrations. In association with the rotation of the rotor 105, the output gear 108 is rotationally driven.

The stacked type piezoelectric element 10 is used as described above, thereby making it possible to provide a vibration wave motor in which the unevenness of the travelling wave is reduced.

In this embodiment, description is made of a vibration wave motor using the stacked type piezoelectric element 10 according to the first embodiment as the stacked type piezoelectric element, but in place of the stacked type piezoelectric element 10, the stacked type piezoelectric element according to the second to fifth embodiments can also be adopted.

This application claims priority from Japanese Patent Application No. 2005-194994 filed on Jul. 4, 2005, which is hereby incorporated by reference herein.

What is claimed is:

1. A stacked type piezoelectric element, comprising:
    a plurality of piezoelectric layers stacked one on another; and
    electrodes that are each arranged between the piezoelectric layers and divided into a plurality of inner electrodes, the electrodes including:
    1) a first group of driving electrodes, to each of which a first predetermined AC voltage is applied so as to drive the stacked type piezoelectric element,
    2) a second group of driving electrodes, to each of which a second predetermined AC voltage having a phase different from that of the first predetermined AC voltage by $\pi/2$ (rad) is applied so as to drive the stacked type piezoelectric element, and
    3) a sensor electrode, to which neither the first nor second predetermined AC voltage is applied and which generates an output signal,
    wherein at least a part of the driving electrodes is exposed to an outside thereof and the area of at least one of the driving electrodes in the first group is greater than that of any one of the driving electrodes in the second group so as to reduce the difference between the cumulative area of the driving electrodes in the first group and the cumulative area of the driving electrodes in the second group, the difference resulting from the existence of the sensor electrode.

2. A stacked type piezoelectric element according to claim 1, wherein a part of at least one of (A) a driving electrode in the first group or the second group, of which phase coincides with that of the sensor electrode, and (B) a driving electrode in the first group or the second group, of which phase is different from that of the sensor electrode by $\pi$ (rad) is exposed to the outside thereof.

3. A stacked type piezoelectric element according to claim 1, wherein the sensor electrode is exposed to the outside thereof.

4. A stacked type piezoelectric element according to claim 1, wherein all the electrodes include at least one inner electrode, a part of which is exposed to the outside thereof.

5. A stacked type piezoelectric element according to claim 1, further comprising a surface electrode layer for forming an end surface of a laminated structure,
    wherein the surface electrode layer comprises electrodes for connecting the electrodes provided between the piezoelectric layers to the outside, respectively.

6. A vibration wave motor, comprising:
    a stacked type piezoelectric element having a plurality of piezoelectric layers stacked one on another;
    elastic members fixed to the stacked type piezoelectric element;
    a rotor that is provided in contact with the elastic members and driven by vibrations generated in the elastic members; and
    electrodes that are each arranged between the piezoelectric layers of the stacked type piezoelectric element, and each divided into a plurality of inner electrodes, the electrodes including:
    1) a first group of driving electrodes, to each of which a first predetermined AC voltage is applied so as to drive the stacked type piezoelectric element,
    2) a second group of driving electrodes, to each of which a second predetermined AC voltage having a phase different from that of the first predetermined AC voltage by $\pi/2$ (rad) is applied so as to drive the stacked type piezoelectric element, and
    3) a sensor electrode, to which neither the first nor second predetermined AC voltage is applied and which generates an output signal,
    wherein at least a part of the driving electrodes is exposed to an outside thereof and the area of at least one of the driving electrodes in the first group is greater than that of any one of the driving electrodes in the second group so as to reduce the difference between the cumulative area of the driving electrodes in the first group and the cumulative area of the driving electrodes in the second group, the difference resulting from the existence of the sensor electrode.

7. A stacked type piezoelectric element, comprising:
    a plurality of piezoelectric layers stacked one on another; and
    electrodes that are each arranged between the piezoelectric layers and divided into a plurality of inner electrodes, the electrodes including:
    1) a first group of driving electrodes, to each of which a first predetermined AC voltage is applied so as to drive the stacked type piezoelectric element,
    2) a second group of driving electrodes, to each of which a second predetermined AC voltage having a phase different from that of the first predetermined AC voltage by $\pi/2$ (rad) is applied so as to drive the stacked type piezoelectric element, and
    3) a sensor electrode, to which neither the first nor second predetermined AC voltage is applied and which generates an output signal, wherein at least a part of the driving electrodes is exposed to an outside and the area of at least one of the driving electrodes in the first group is greater than that of any one of the driving electrodes in the second group.

8. A vibration wave motor, comprising:

a stacked type piezoelectric element having a plurality of piezoelectric layers stacked one on another;

elastic members fixed to the stacked type piezoelectric element;

a rotor that is provided in contact with the elastic members and driven by vibrations generated in the elastic members; and electrodes that are each arranged between the piezoelectric layers of the stacked type piezoelectric element, and each divided into a plurality of inner electrodes, the electrodes including:

1) a first group of driving electrodes, to each of which a first predetermined AC voltage is applied so as to drive the stacked type piezoelectric element,
2) a second group of driving electrodes, to each of which a second predetermined AC voltage having a phase different from that of the first predetermined AC voltage by $\pi/2$ (rad) is applied so as to drive the stacked type piezoelectric element, and
3) a sensor electrode, to which neither the first nor second predetermined AC voltage is applied and which generates an output signal, wherein at least a part of the driving electrodes is exposed to an outside and the area of at least one of the driving electrodes in the first group is greater than that of any one of the driving electrodes in the second group.

* * * * *